United States Patent
Kawahara et al.

(10) Patent No.: US 9,245,994 B2
(45) Date of Patent: Jan. 26, 2016

(54) MOSFET WITH CURVED TRENCH FEATURE COUPLING TERMINATION TRENCH TO ACTIVE TRENCH

(71) Applicant: Texas Instruments Incorporated, Dallas, TX (US)

(72) Inventors: Hideaki Kawahara, Plano, TX (US); Christopher Boguslaw Kocon, Mountain Top, PA (US); Simon John Molloy, Allentown, PA (US); John Manning Savidge Neilson, Norristown, PA (US)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 43 days.

(21) Appl. No.: 14/175,456

(22) Filed: Feb. 7, 2014

(65) Prior Publication Data

US 2014/0217497 A1    Aug. 7, 2014

Related U.S. Application Data

(60) Provisional application No. 61/762,177, filed on Feb. 7, 2013.

(51) Int. Cl.
*H01L 29/78* (2006.01)
*H01L 29/40* (2006.01)

(52) U.S. Cl.
CPC .......... *H01L 29/7811* (2013.01); *H01L 29/407* (2013.01)

(58) Field of Classification Search
CPC .............. H01L 29/7827; H01L 29/407; H01L 29/7811
See application file for complete search history.

(56) References Cited

U.S. PATENT DOCUMENTS

| | | | |
|---|---|---|---|
| 7,859,037 B2* | 12/2010 | Parthasarathy | H01L 27/0207 257/302 |
| 8,653,600 B2* | 2/2014 | Parthasarathy | H01L 29/0692 257/367 |
| 2008/0164516 A1* | 7/2008 | Darwish | 257/329 |
| 2008/0197418 A1* | 8/2008 | Parthasarathy | H01L 9/0696 257/367 |
| 2009/0057756 A1 | 3/2009 | Hshieh | |
| 2011/0233657 A1* | 9/2011 | Parthasarathy et al. | 257/329 |
| 2013/0193502 A1 | 8/2013 | Kocon et al. | |

* cited by examiner

*Primary Examiner* — Caleb Henry
*Assistant Examiner* — Mounir Amer
(74) *Attorney, Agent, or Firm* — Jacqueline J. Garner; Frank D. Cimino

(57) ABSTRACT

A metal oxide semiconductor field effect transistor (MOSFET) in and on a semiconductor surface provides a drift region of a first conductivity type. A plurality of active area trenches in the drift region, and first and second termination trenches are each parallel to and together sandwiching the active area trenches. The active area trenches and termination trenches include a trench dielectric liner and electrically conductive filler material filled field plates. A gate is over the drain drift region between active area trenches. A body region of a second conductivity abuts the active region trenches. A source of the first conductivity type is in the body region on opposing sides of the gate. A vertical drain drift region uses the drift region below the body region. A first and second curved trench feature couples the field plate of the first and second termination trench to field plates of active area trenches.

16 Claims, 5 Drawing Sheets

MOSFET WITH CURVED TRENCH FEATURE COUPLING TERMINATION TRENCH TO ACTIVE TRENCH

CROSS REFERENCE TO RELATED APPLICATIONS

This application claims the benefit of Provisional Application Ser. No. 61/762,177 entitled "CURVED TRENCH FEATURE FOR IMPROVEMENT OF DEVICE TERMINATION", filed Feb. 7, 2013, which is herein incorporated by reference in its entirety.

FIELD

Disclosed embodiments relate to metal-oxide-semiconductor field-effect transistors (MOSFETs) having electrically conductive filler material (e.g., polysilicon) filled trenches including structures for reducing leakage at the termination trench which border at least two sides of an active region including electrically conductive filler material filled trenches.

BACKGROUND

Some MOSFETS include vertical trenchFETs having polysilicon filled gate trenches in an active region and a polysilicon filled termination trench which surrounds the active region. A topside contact on the termination trench allows a metal connector to be used to connect the termination trench to one of the polysilicon filled trenches in the active region so that the termination trench is biased (e.g., grounded). Additional doping under the termination trench is known to further reduce termination trench leakage.

Other MOSFET designs instead of using the polysilicon filled trenches as gate trenches, use the polysilicon filled trenches as field plates and provide a substantially planar FET structure, where the trench polysilicon is connected to source in the case of NMOS, not connected to the gate electrode as in vertical trenchFET. For example, these MOSFETs have a gate structure and a vertical drain drift region between polysilicon filled trenches configured to act as field plates sometimes referred to as "RESURF trenches". For purposes of this patent application, the term "RESURF" is understood to refer to a material which reduces an electric field in an adjacent semiconductor region. A RESURF region may be for example a semiconductor region with an opposite conductivity type from the adjacent semiconductor region. RESURF structures are described in Appels, et.al., "Thin Layer High Voltage Devices" Philips J, Res. 35 1-13, 1980.

The RESURF trenches contain a dielectric liner and are generally filled with doped polysilicon. In the active region for n-channel MOSFETs the RESURF trenches (hereafter "active area trenches") are polysilicon field plates which are electrically coupled to a source electrode. In the case of a n-channel MOSFET, there is a p-body region within an n-drift region on a substrate, where n-type dopants are in the source regions formed in the p-body region. The drain for the MOSFET can be a vertical drain drift region that uses the entire n-drift region below the p-body region, that has a drain contact on the bottom of the substrate, which can be an n+ substrate.

A contact metal stack makes electrical contact with a source region at lateral sides of the contact structure, makes electrical contact with a p-body contact region at a bottom surface of contact structure, and makes electrical contact to the polysilicon field plates in the active area trenches at the bottom surface of the contact structure. Another RESURF trench which is referred to as a "termination trench" is at a perimeter around the active area trenches.

SUMMARY

Disclosed embodiments relate to the metal-oxide-semiconductor field-effect transistor (MOSFET) described above having a gate structure and a vertical drain drift region positioned between active area trenches. Disclosed embodiments recognize most of the active area of the active area trenches on a discrete MOSFET device or an integrated circuit (IC) with one or more discrete MOSFET devices, in the case of an n-channel MOSFET are connected with a source contact, but the termination trench surrounding the active region cannot generally be connected to a source because a contact cannot be placed on the termination trench due to a design rule difficulty. Specifically, the trench fill material (typically polysilicon) is too narrow to place the contact without overhanging on top of the trench dielectric liner which if experiencing high voltage during operation can cause the trench dielectric liner a dielectric integrity issue leading to a low breakdown voltage and a resulting leakage or a short Related U.S. application Ser. No. 13/744,097 to Kocon et al., hereafter "the '097 application" where Kocon is one of the inventors of this application as well, discloses the MOSFET described above having a gate structure on a drift region of a first conductivity type and a body region of a second conductivity type formed in the drift region, having sources formed in the body region. A vertical drain drift region is positioned between active area trenches, where the active area trenches are connected to the source of the MOSFET.

In one embodiment of the '097 application there is a single polysilicon filled trench connector between the termination trench (which surrounds/encloses the active area including MOSFETs and a plurality of active area trenches) and one of the active area trenches so that the termination trench is electrically connected (as opposed to electrically floating) to the source of one of the active area trenches (see FIG. 2A in the '097 application) associated with a n-channel MOSFET. The polysilicon trench connector is disclosed as a straight line trench connector which has the advantage of minimizing the length of the trench connector and thus its resistance. This application incorporates the '097 application by reference in its entirety.

Disclosed embodiments are based on the finding the straight line trench connector disclosed in the '097 application results in square corners in the termination region which create enhanced electric field regions on the termination trench corner during circuit operation leading to a low breakdown voltage of the trench dielectric liner as compared to the active area trenches. Moreover, the square corners of the termination region have been found to produce a large walking out of the breakdown voltage curve.

Disclosed embodiments provide a solution to the low voltage breakdown/walking out problem for the termination trench by using a looped curved trench feature topology including a non-enclosing/non-surrounding termination trench structure having a first termination trench and a second termination trench each parallel to and together sandwiching the plurality of active area trenches. At least a first curved trench feature couples the field plate of the first termination trench to a field plate a first active area trench, and at least a second curved trench feature couples the field plate of the second termination trench to the field plate of a second active area trench. The disclosed looped topology for curved trench features eliminates the square trench connector corners disclosed in the '097 application, which has been found to enhance the breakdown voltage characteristics of the termination trenches as described below in the Examples section. Disclosed trench coupling structures also allow maintaining the appropriate voltage bias of the electronically conductive filler material (e.g., polysilicon) in the termination trenches without the need for adding a separate contact.

BRIEF DESCRIPTION OF THE DRAWINGS

Reference will now be made to the accompanying drawings, which are not necessarily drawn to scale, wherein.

DETAILED DESCRIPTION

Figure 1A:
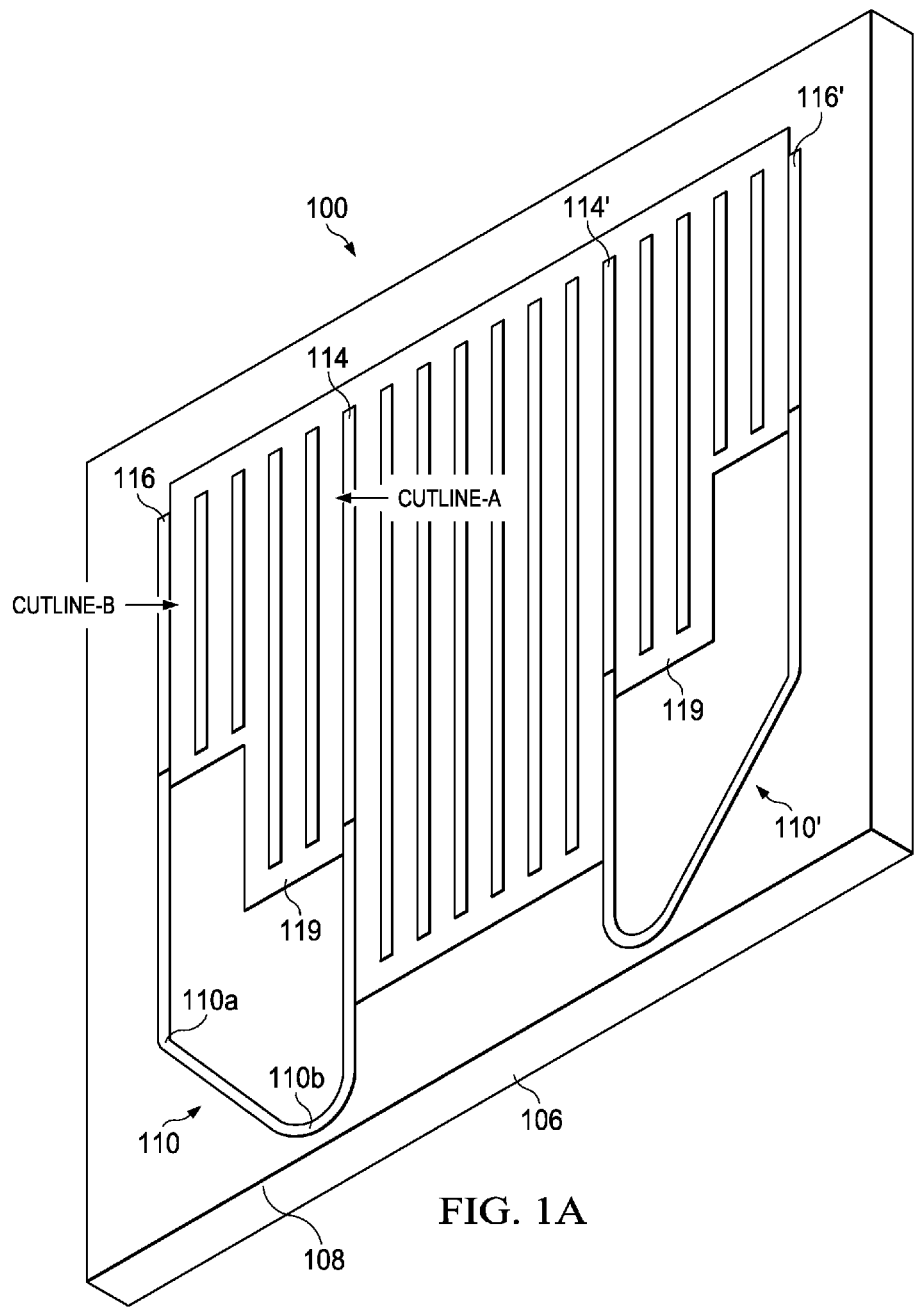
FIG. 1A is a perspective view of a portion of a disclosed MOSFET device including a first curved trench feature and a second curved trench feature coupling the respective termination trenches to active area trenches, according to an example embodiment.

Example embodiments are described with reference to the drawings, wherein like reference numerals are used to designate similar or equivalent elements. Illustrated ordering of acts or events should not be considered as limiting, as some acts or events may occur in different order and/or concurrently with other acts or events. Furthermore, some illustrated acts or events may not be required to implement a methodology in accordance with this disclosure.

Also, the terms "coupled to" or "couples with" (and the like) as used herein without further qualification are intended to describe either an indirect or direct electrical connection. Thus, if a first device "couples" to a second device, that connection can be through a direct electrical connection where there are only parasitics in the pathway, or through an indirect electrical connection via intervening items including other devices and connections. For indirect coupling, the intervening item generally does not modify the information of a signal but may adjust its current level, voltage level, and/or power level.

FIG. 1A is a perspective view of a portion of a MOSFET device 100 including a disclosed first curved trench feature 110 coupling a first termination trench 116 to an active area trench 114, and a disclosed second curved trench feature 110' coupling a second termination trench 116' to an active area trench 114', according to an example embodiment. The first termination trench 116 and a second termination trench 116' are each parallel to and together sandwiching the plurality of active area trenches shown in FIG. 1A including the active area trenches 114 and 114'.

MOSFET device 100 is built on a semiconductor surface 108 of a substrate 106. Although not shown, MOSFET device 100 is configured with MOS gates between active area trenches 114 (see FIG. 3). Active regions (where there is no field dielectric on the semiconductor surface 108 described as an n-drift region in FIG. 1B and FIG. 1C) are shown as 119. Although not shown in FIG. 1A, the curved trench features 110 and 110' extend under the termination field dielectric (e.g., field oxide).

The disclosed curved trench features 110 and 110' can be seen to have both its curved corners having at least one of (i) a minimum angle of at least 120 degrees and (ii) a radius of curvature (ROC) of ≥3 µm, with the curved corners of curved trench feature 100 shown as 110a and 110b. Curved corner 110a can be seen to have an angle of at least about 135 degrees and ROC of about 3 µm, while curved corner 110b has an angle of at about 120 degrees and an ROC of about 4 µm. Accordingly, all corners of the curved trench features 110 and 110' are curved/rounded, which may be contrasted with the straight line connection trench connector which results in square corners (90 degrees) disclosed in the '097 application. As used herein, "curved corners" is defined to be termination trench corner configurations having at least one of a (i) minimum angle of at least 110 degrees, such as 120 to 150 degrees) and (ii) a ROC of ≥3 µm. Disclosed curved corners thus clearly exclude all 90 degree corners (with an undefined ROC), and their near variants spanning 85 to 95 degrees, and other angles less than such as 85 degrees, and angles up to almost 110 degrees (e.g., 109 degrees).

Figure 1B:
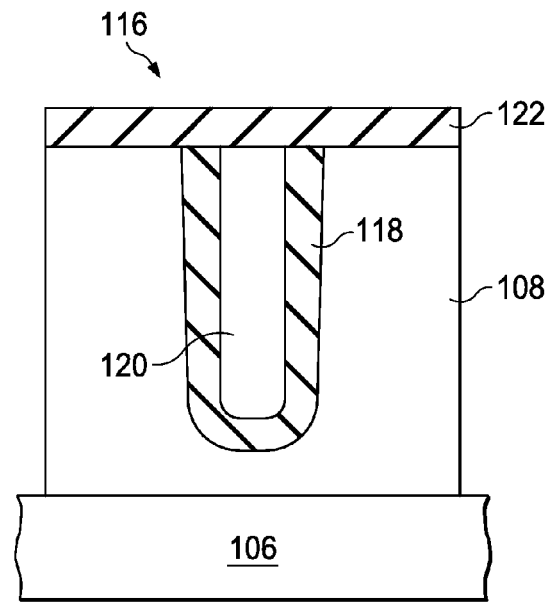
FIG. 1B is a cross sectional view of one of the termination trenches shown in FIG. 1A along cutline-B shown.

FIG. 1B is a cross sectional view of the termination trench 116 shown in FIG. 1A along cutline-B shown, which is the same as termination trench 116' shown in FIG. 1A. Termination trench 116 is shown formed in a semiconductor surface 108 that is on a substrate 106. In one particular embodiment for a n-channel MOSFET (See FIG. 3 described below), the top semiconductor surface 108 comprises an n-drift region including a p-body region formed therein and the substrate 106 is an n+ drain contact region for the n-channel MOSFET which provides a contact to a vertical drain drift region positioned between active area trenches which are connected to a source of the MOSFET.

The substrate 106 and/or semiconductor surface 108 more generally can comprise silicon, silicon-germanium, or other semiconductor material. In one particular arrangement the semiconductor surface 108 is epitaxially oriented relative to the substrate 106, such as n− epitaxial layer on an n+ substrate for NMOS, or as p− epitaxial layer on a p+ substrate for PMOS. Another example is a silicon/germanium (SiGe) semiconductor surface 108 epitaxially grown on a silicon substrate 106.

Termination trench 116 is shown including an electrically conductive filler material 120 generally comprising doped polysilicon. However, other high temperature tolerant electrically conductive filler materials can be used, such as tungsten. In the case of doped polysilicon, the polysilicon is generally doped (e.g. n+ or p+), which can be doped in-situ with the polysilicon deposition, or deposited undoped and then ion implanted with one or more dopant ions. The termination trench 116 is generally 0.5 µm to 2 µm wide.

The trench dielectric liner 118 is a dielectric material which can comprise silicon oxide, or another dielectric material such as silicon nitride or silicon oxynitride, or a metal comprising high-k dielectric (k>5) material such as HfO$_2$. Although shown as a single layer, the trench dielectric liner 118 can comprise a relatively thin thermal silicon oxide layer (e.g., 50 to 100 nm) followed by a relative thick deposited dielectric layer (200 nm to 400 nm of deposited silicon oxide).

A second dielectric layer 122 is shown over the top of the termination trench 116. In one embodiment the second dielectric layer 122 comprises a tetra-ethoxy-silane (TEOS) derived silicon oxide layer. The second dielectric layer 122 is on top of the termination trench 116 without a contact because as disclosed above the termination trench cannot be connected to a source (for an n-channel MOSFET) in the surrounding the active region because a contact cannot generally be placed on the termination trench 116 due to the trench filling polysilicon being too narrow to place the contact without overhanging onto the trench dielectric liner 118, which can cause a trench liner dielectric integrity issue leading to a low breakdown voltage for trench dielectric liner 118.

Figure 1C:
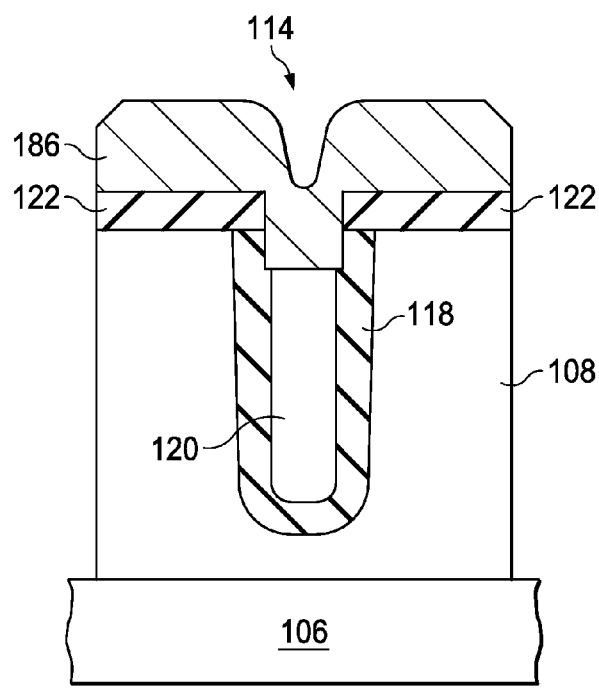
FIG. 1C is a cross sectional view of the active area trench shown in FIG. 1A along cutline-A shown.

FIG. 1C is a cross sectional view of the active area trench 114 shown in FIG. 1A along cutline-A shown, which is the same as active area trench 114' shown in FIG. 1A. As with termination trench 116, active area trench 114 is shown formed in a semiconductor surface 108 that is on a substrate 106, and includes electrically conductive filler material 120 generally comprising polysilicon, that is generally doped (e.g. n+), which can be doped in-situ with the polysilicon deposition, or deposited undoped and then ion implanted with one or more dopant ions. The trench dielectric liner 118 can comprise silicon oxide, or another dielectric material such as silicon nitride or silicon oxynitride, or a metal comprising high-k dielectric (k>5) material such as HfO$_2$. A second dielectric layer 122 is shown over the top of the termination trench 116. Active area trench 114 includes a contact in the second dielectric layer 122 which allows the metal layer 186, for example 2 to 5 microns of sputtered aluminum, to contact the electrically conductive filler material 120 at the top of the active trench. The active area trench 114 is generally the same width as the termination trenches 116, 116' disclosed above to be from 0.5 μm to 2 μm wide.

Figure 2A:
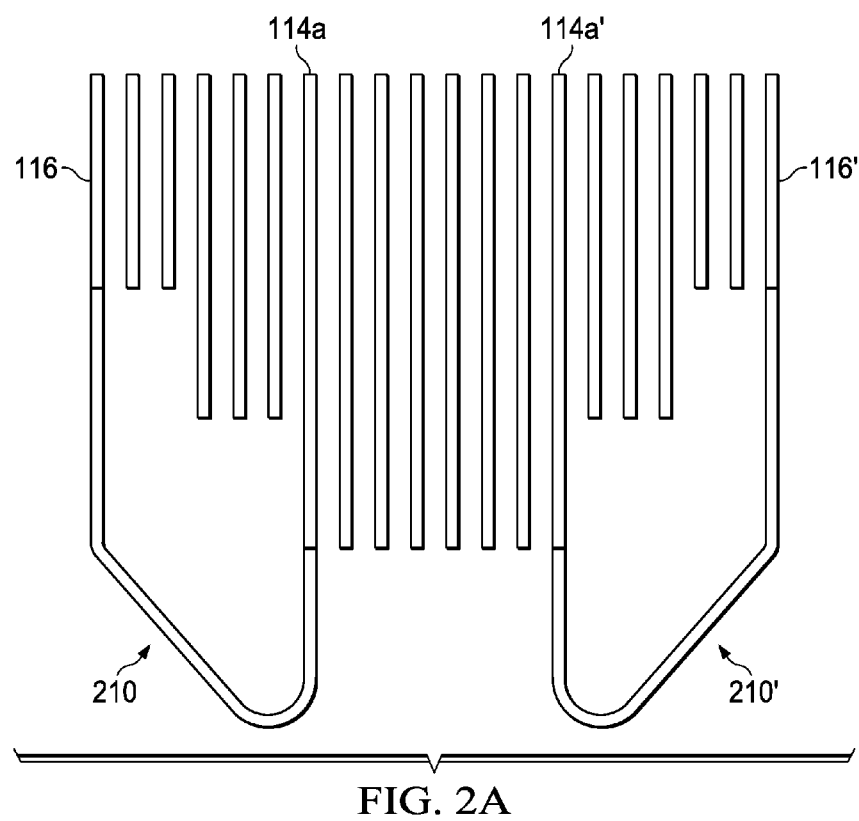
FIGS. 2A and 2B are examples of variants of the curved trench features shown in FIG. 1A demonstrating disclosed curved trench features provide flexibility for a variety of trench termination schemes coupling to different active area trenches because of the flexibility provided by the disclosed looped topology.
Figure 2B:
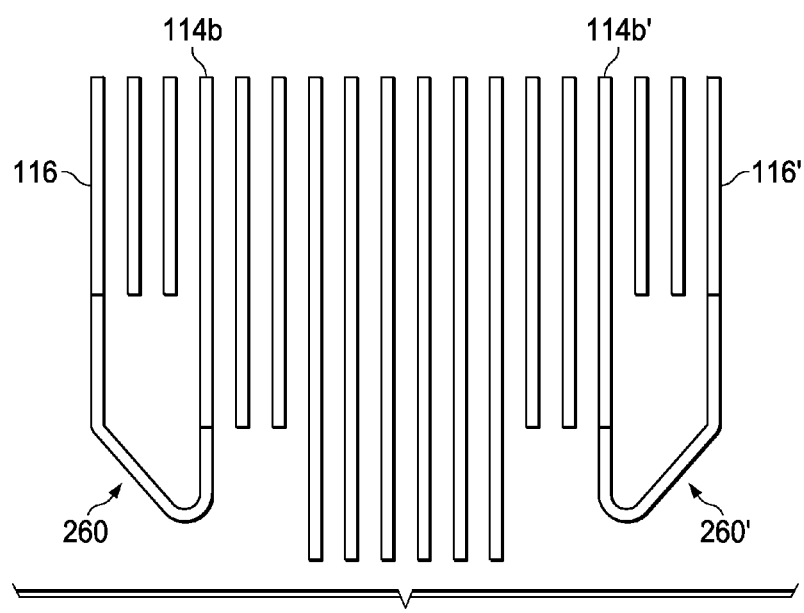

FIGS. 2A and 2B are examples of variants of the curved trench connecting features 110 and 110' shown in FIG. 1A demonstrating disclosed curved trench connecting features provide flexibility for a variety of trench termination scheme connector to different active area trenches because of the flexibility provided by the looped topology. In FIG. 2A the curved trench connecting feature 210 connects termination trench 116 to active area trench 114a and curved trench connecting feature 210' connects termination trench 116' to active area trench 114a' in one particular curved topology. In FIG. 2B the curved trench connecting feature 260 connects termination trench 116 to active area trench 114b' and curved trench connecting feature 260' connects termination trench 116' to active area trench 114b' in another particular curved topology. The curved trench connecting feature placement flexibility provided can be helpful for the circuit designer during layout.

Figure 2C:
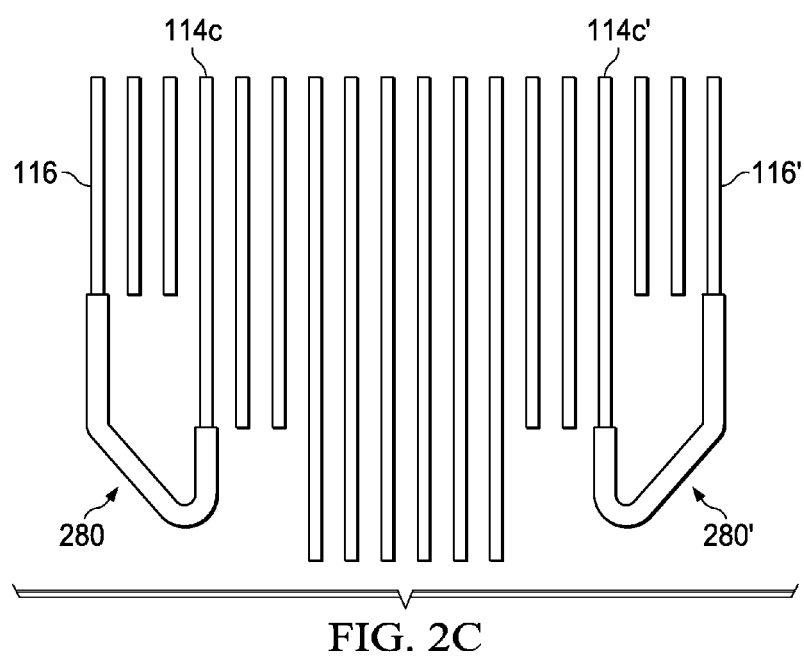
FIG. 2C is a depiction based on FIG. 2B, except the curved trench features coupling the field plates in the termination trenches to the field plates in the active area trenches are at least 20% wider as compared to the width of both the termination trenches and the active area trenches, according to an example embodiment.

FIG. 2C is a depiction based on FIG. 2B, except the curved trench features shown as 280 and 280' coupling the termination trenches 116 and 116' to active area trenches 114c and 114c' respectively, are at least 20% wider as compared to both the termination trenches and the active area trenches, according to an example embodiment. Widening the curved trench features reduce its resistance.

Figure 3:
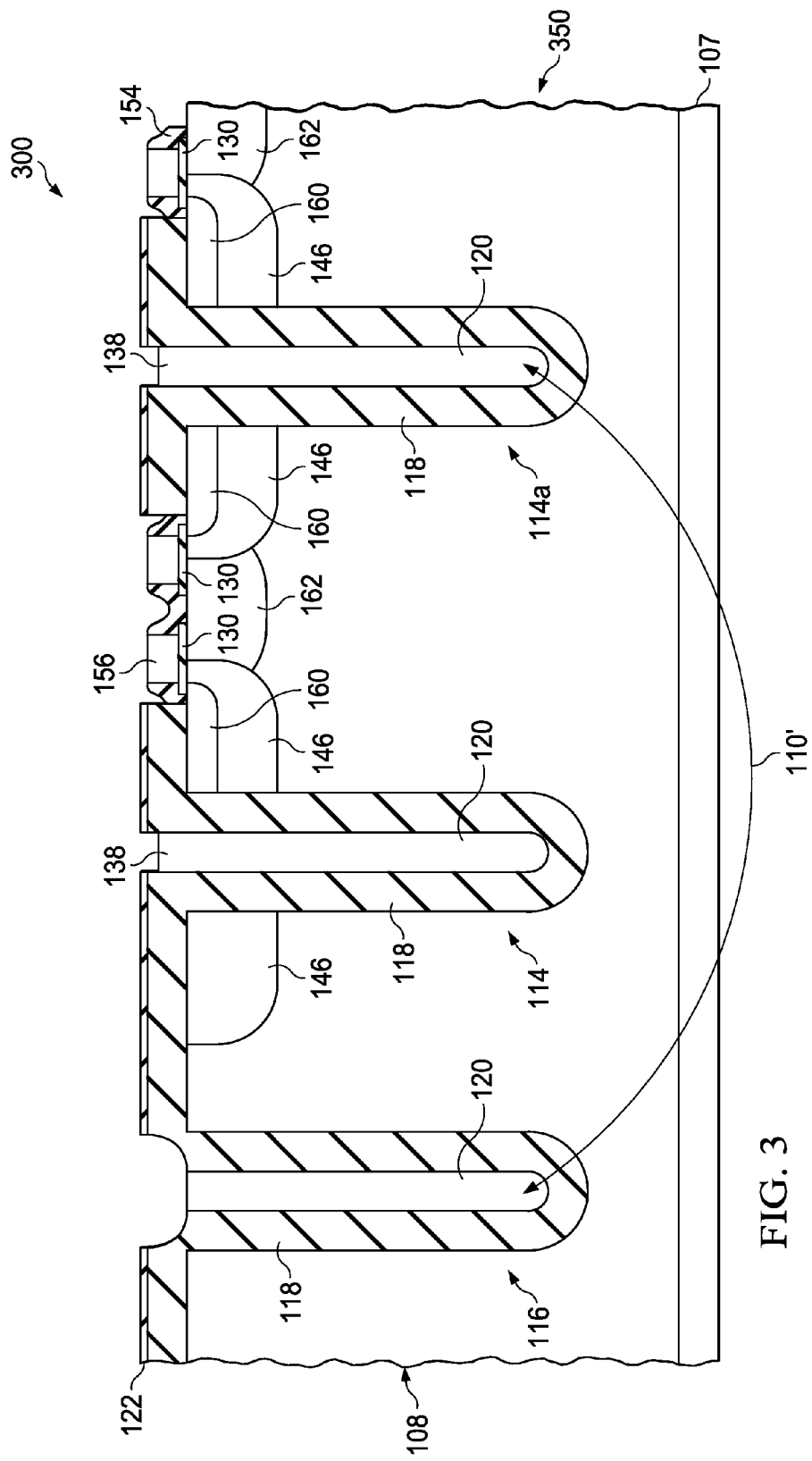
FIG. 3 is a cross sectional view of an example semiconductor device comprising an n-channel MOSFET device including a first termination trench and a second termination trench each parallel to and together sandwiching the plurality of active area trenches in an active area, which implements disclosed curved trench features for coupling a field plate of the respective termination trenches to field plates of active area trenches, according to an example embodiment.

FIG. 3 is a cross sectional view of an example semiconductor device 350 including an n-channel MOSFET device 300 including a first termination trench 116 and a second termination trench each parallel to and together sandwiching a plurality of active area trenches with active area trenches 114 and 114a shown in an n– drift region 108, which implements disclosed curved trench connecting features. Although only a first termination trench 116 is shown in FIG. 3, it is understood to be another termination trench to the right of the last active area trench to the right of active area trench 114a, such as corresponding to the trench pattern shown in the portion of a disclosed MOSFET device 100 described above in FIG. 1A.

The MOSFET device 300 of FIG. 3 corresponds to FIG. 1P in the '097 application to Kocon et al. with modification so that instead of a single termination trench enclosing/surrounding the active area trenches there is a non-enclosing termination trench arrangement comprising a first termination trench and a second termination trench each parallel to and together sandwiching the plurality of active area trenches. There is also simplification by removing the dielectric, top side contacts and the metal over the MOSFET device 300.

A split gate is shown including gate electrodes 156 although a split gate is an optional feature for MOSFET device 300. The '097 application refers to a single "perimeter RESURF trench" which as noted above is replaced herein by a first termination trench shown in FIG. 3 as 116 and a second termination trench that as described above although not shown is to the right of the rightmost active area trench 114a shown in FIG. 3.

A p-body region is shown as 146 formed in the n-drift region 108, which can be epitaxial relative to the substrate 107. A curve with arrows on its ends labeled as 110$_1$ is shown connecting the electrically conductive filler material 120 in the termination trench 116 and the electrically conductive filler material 120 in the active area trench 114a to indicate the presence a disclosed curved trench connecting feature, such as curved trench connecting feature 110 or 110' shown in FIG. 1A.

N-type dopants are in the source regions 160 formed in the p-body region 146. The source regions 160 are shown extending under the gate sidewall spacers 154. The gate dielectric layer is shown as 130. A patterned polysilicon that provides gate electrodes 156 is over the gate dielectric layer 130. The trench dielectric liner 118 is under the second dielectric layer 122. N-type LDD regions are shown as 162. The drain for MOSFET device 300 is a vertical drain drift region that uses the entire n-drift region 108 below the p-body region 146 (so that no reference number for the drain is shown in FIG. 3), which has a drain contact on the bottom of the substrate 107 which can be an n+ substrate, such as an n+ silicon substrate The polysilicon layer for the gate electrode 156 may include 100 to 200 nanometers of polysilicon and possibly a layer of metal silicide (not shown) on the polysilicon, such as 100 to 200 nanometers of tungsten silicide. Other materials for the gate electrode 156 are within the scope of this disclosure.

Advantages of disclosed curved corner trench coupling structures include improved trench breakdown voltage and minimized walk out on trench field plate FET technology. Disclosed curved trench coupling structures allow providing an appropriate voltage bias from active area trenches through trench coupling features to the termination trenches which simultaneously reduces the electric (E)-field at the termination region to improve the breakdown voltage at the trench termination device region. This structure allows flexibility of a variety of trench termination schemes (see FIGS. 2A and 2B) at the edge of the active region because of flexibility of looped topology of disclosed curved trench coupling structures.

EXAMPLES

Disclosed embodiments are further illustrated by the following specific Example, which should not be construed as limiting the scope or content of this Disclosure in any way. The Example described in this Example is for n-channel MOSFETs having trench field plates. It will be recognized that p-channel MOSFETs having similar features may be formed by appropriate changes in dopant polarities and conductivity types.

BV data was obtained for an n-channel MOSFET device 300 having trench field plates disclosed in FIG. 3 having the straight line trench connector disclosed in FIG. 2A of the '097 application which shows a termination trench surrounding the MOSFET and its active area trenches. The termination trench is connected to an instance of the active area trenches by a straight line trench connector (and resulting square corner) so that the field plate in the termination trench is electrically connected to the field plate in an active transistor trench. This BV data obtained was used as a control.

BV data was also obtained from a disclosed device being the n-channel MOSFET device 300 disclosed in FIG. 3/FIG. 2A of the '097 application modified to have a disclosed first termination trench and a second termination trench each parallel to and together sandwiching the plurality of active area trenches, and a first and a second disclosed curved trench connecting feature analogous to features 110 and 110' shown in FIG. 1A coupling the respective termination trenches to active area trenches, according to a disclosed embodiment. Comparing the BV data obtained from this disclosed n-channel MOSFET with the BV data obtained from the '097 n-channel MOSFET device (control) revealed the disclosed curved corner trench coupling features provide a significantly improved BV and minimize the drift of the BV commonly referred to as "walk out". Specifically, for the disclosed n-channel MOSFET device having the curved trench features the BV was increased about 7 V, and the walk-out was about halved as compared to the n-channel MOSFET disclosed in '097 application.

Disclosed embodiments can be used to form semiconductor die that may be integrated into a variety of assembly flows to form a variety of different devices and related products. The semiconductor die may include various elements therein and/or layers thereon, including barrier layers, dielectric layers, device structures, active elements and passive elements including source regions, drain regions, bit lines, bases, emitters, collectors, conductive lines, conductive vias, etc. Moreover, the semiconductor die can be formed from a variety of processes including bipolar, Insulated Gate Bipolar Transistor (IGBT), CMOS, BiCMOS and MEMS. The semiconductor die can also be a discrete die.

Those skilled in the art to which this disclosure relates will appreciate that many other embodiments and variations of embodiments are possible within the scope of the claimed invention, and further additions, deletions, substitutions and modifications may be made to the described embodiments without departing from the scope of this disclosure.

The invention claimed is:
1. A semiconductor device, comprising:
a substrate including a semiconductor surface;
a metal oxide semiconductor field effect transistor (MOSFET) in and on said semiconductor surface which provides a drift region of a first conductivity type, said MOSFET including:
a plurality of active area trenches disposed in said drift region;
a first and a second termination trench disposed in said drift region each parallel to and together sandwiching said plurality of active area trenches;
wherein each of said plurality of active area trenches and said first and said second termination trench include a trench dielectric liner and an electrically conductive filler material as a field plate;
at least one gate disposed over said drift region between said plurality of active area trenches;
a body region of a second conductivity type, opposite from said first conductivity type, disposed in said drift region abutting said plurality of active area trenches,
a source of said first conductivity type formed in said body region on opposing sides of said gate;
a vertical drain drift region using said drift region below said body region having a drain contact on said substrate, and
a first curved trench feature laterally extending from the first termination trench to a first of said plurality of active area trenches to couple said field plate of said first termination trench to said field plate of the first of said plurality of active area trenches, and a second curved trench feature laterally extending from the second termination trench to a second of said plurality of active area trenches to couple said field plate of said second termination trench to said field plate of the second of said plurality of active area trenches, wherein laterally extending regions of the first curved trench feature include curved regions and wherein laterally extending regions of the second curved trench feature include curved regions.

2. The semiconductor device of claim 1, wherein said electrically conductive filler material comprises doped polysilicon.

3. The semiconductor device of claim 2, wherein said doped polysilicon comprises n+ doped polysilicon.

4. The semiconductor device of claim 2, wherein said doped polysilicon comprises p+ doped polysilicon.

5. The semiconductor device of claim 1, wherein said first and said second curved trench features in curved regions thereof all provide at least one of an angle of least 110 degrees and a radius of curvature (ROC) of ≥3 μm.

6. The semiconductor device of claim 5, wherein said first and said second curved trench features each have a trench width≥20% more than a width of said plurality of active area trenches and a width of said first and said second termination trenches.

7. The semiconductor device of claim 1, wherein said first conductivity type is n-type and said MOSFET is an n-channel MOSFET.

8. The semiconductor device of claim 1, wherein said gate is a split gate having central openings in a central area between ones of said plurality of active area trenches.

9. The semiconductor device of claim 1, wherein said trench dielectric liner comprises silicon oxide, silicon nitride, or silicon oxynitride.

10. The semiconductor device of claim 1, wherein said semiconductor surface comprises silicon.

11. The semiconductor device of claim 1, wherein the first curved trench feature laterally extends from the first termination trench to the first of said plurality of active area trenches without forming a 90° angle and wherein the second curved trench feature laterally extends from the second termination trench to the second of said plurality of active area trenches without forming a 90° angle.

12. A semiconductor device, comprising:
a silicon substrate including a silicon comprising surface;
a metal oxide semiconductor field effect transistor (MOSFET) in and on said silicon comprising surface which provides an n-drift region, said MOSFET including:
a plurality of active area trenches disposed in said n-drift region;
a first and a second termination trench disposed in said n-drift region each parallel to and together sandwiching said plurality of active area trenches;
wherein each of said plurality of active area trenches and said first and said second termination trench include a trench dielectric liner and an electrically conductive filler material as a field plate;
at least one gate disposed over said n-drift region between said plurality of active area trenches;
a p-body region disposed in said n-drift region abutting said plurality of active area trenches,
an n-type source formed in said p-body region on opposing sides of said gate;
a vertical drain drift region using said n-drift region below said p-body region having a drain contact on said silicon substrate, and
at least a first curved trench feature providing a laterally extending connection between the first termination trench and a first of the plurality of active area trenches to couple said field plate of said first termination trench to said field plate of the first of said plurality of active area trenches, and at least a second curved trench feature providing a laterally extending connection between the second termination trench and a second of the plurality of active area trenches to couple said field plate of said second termination trench to said field plate of the second of said plurality of active area trenches.

13. The semiconductor device of claim 12, wherein said first and second curved trench features in curved regions thereof all provide at least one of an angle of at least 110 degrees and a radius of curvature (ROC) of ≥3 μm.

14. The semiconductor device of claim 12, wherein said electrically conductive filler material comprises n+ doped polysilicon.

15. The semiconductor device of claim 12, wherein said electrically conductive filler material comprises p+ doped polysilicon.

16. A semiconductor device, comprising:
a substrate including a semiconductor surface;
a metal oxide semiconductor field effect transistor (MOSFET) in and on said semiconductor surface which provides a drift region of a first conductivity type, said MOSFET including:
a plurality of active area trenches disposed in said drift region;
a first and a second termination trench disposed in said drift region each parallel to and together sandwiching said plurality of active area trenches;
wherein each of said plurality of active area trenches and said first and said second termination trench include a trench dielectric liner and an electrically conductive filler material as a field plate;
at least one gate disposed over said drift region between said plurality of active area trenches;
a body region of a second conductivity type, opposite from said first conductivity type, disposed in said drift region abutting said plurality of active area trenches,
a source of said first conductivity type formed in said body region on opposing sides of said gate;
a vertical drain drift region using said drift region below said body region having a drain contact on said substrate, and
a first curved connection trench laterally extending between the first termination trench and a first of said plurality of active area trenches and a second curved connection trench laterally extending between the second termination trench and a second of said plurality of active area trenches, wherein the first curved connection includes no 90° angles and the second curved connection includes no 90° angles.

* * * * *